United States Patent
Sung et al.

(10) Patent No.: US 9,953,879 B1
(45) Date of Patent: Apr. 24, 2018

(54) PREVENTING OXIDATION DEFECTS IN STRAIN-RELAXED FINS BY REDUCING LOCAL GAP FILL VOIDS

(71) Applicant: GLOBALFOUNDRIES Inc., Grand Cayman (KY)

(72) Inventors: Min Gyu Sung, Latham, NY (US); Hoon Kim, Horseheads, NY (US); Chanro Park, Clifton Park, NY (US); Ruilong Xie, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/284,110

(22) Filed: Oct. 3, 2016

(51) Int. Cl.
| | |
|---|---|
| *H01L 21/8234* | (2006.01) |
| *H01L 21/762* | (2006.01) |
| *H01L 29/66* | (2006.01) |
| *H01L 21/02* | (2006.01) |
| *H01L 27/092* | (2006.01) |

(52) U.S. Cl.
CPC ............... *H01L 21/823481* (2013.01); *H01L 21/02164* (2013.01); *H01L 21/02271* (2013.01); *H01L 21/02318* (2013.01); *H01L 21/76224* (2013.01); *H01L 27/0922* (2013.01); *H01L 29/66795* (2013.01)

(58) Field of Classification Search
CPC ............... H01L 29/785; H01L 29/7856; H01L 29/823481; H01L 29/76224; H01L 29/66795; H01L 29/1604; H01L 29/161
See application file for complete search history.

(56) References Cited

U.S. PATENT DOCUMENTS

| | | | | |
|---|---|---|---|---|
| 2011/0081782 | A1* | 4/2011 | Liang | C23C 16/345 438/697 |
| 2014/0227858 | A1* | 8/2014 | Shen | H01L 21/76224 438/430 |
| 2015/0228653 | A1* | 8/2015 | Cheng | H01L 27/0924 257/369 |
| 2015/0340500 | A1* | 11/2015 | Brunco | H01L 21/02532 257/190 |

* cited by examiner

*Primary Examiner* — Laura Menz
*Assistant Examiner* — Candice Y Chan
(74) *Attorney, Agent, or Firm* — Wayne F. Reinke, Esq.; Heslin Rothenberg Farley & Mesiti P.C.

(57) ABSTRACT

A semiconductor structure includes a strain-relaxed semiconductor substrate, fins on the strain-relaxed semiconductor substrate, the fins each having a bottom inactive region and an exposed top active region. The semiconductor structure further includes a liner layer along sidewalls of the bottom inactive region and adjacent surface areas of the strain-relaxed semiconductor substrate, a densified local fill layer surrounding the bottom inactive regions of the plurality of fins, a densified global fill layer adjacent outer sidewalls of the densified local fill layer, and a hard mask layer separating the densified global fill layer from the substrate and the densified local fill layer, a lack of voids in the densified local fill layer resulting in the bottom inactive regions of the fins being substantially free of oxidation defects. A method to realize the structure is also disclosed, the method preventing oxidation defects in strain-relaxed fins by reducing local gap fill voids.

16 Claims, 7 Drawing Sheets

PREVENTING OXIDATION DEFECTS IN STRAIN-RELAXED FINS BY REDUCING LOCAL GAP FILL VOIDS

BACKGROUND OF THE INVENTION

Technical Field

The present invention generally relates to preventing defects in FinFET-based semiconductor structures. More particularly, the present invention relates to preventing oxidation defects in strain-relaxed fins by reducing local gap fill voids.

Background Information

As the fin pitch of FinFETs continues to shrink, deposition of gap fill using HARP $SiO_2$ becomes problematic, as voids begin to form. To combat the void issue, flowable oxide has been used. However, this requires a high temperature seam anneal in order to achieve densification, which may also cause fin oxidation after removal of unwanted fins.

SUMMARY OF THE INVENTION

Thus, a need continues to exist for a way to prevent oxidation defects in strain-relaxed fins exposed to a high temperature seam anneal.

The shortcomings of the prior art are overcome and additional advantages are provided through the provision, in one aspect, of a method of reducing or eliminating voids in gap fill material of semiconductor structures. The method includes providing a starting semiconductor structure, the starting semiconductor structure including a stress-relaxed buffer (SRB) semiconductor substrate with a relatively low concentration of germanium in silicon germanium, a plurality fins coupled to the SRB semiconductor substrate, each fin including a top active region with a relatively higher percentage of germanium in silicon germanium as compared to the SRB semiconductor substrate, and a bottom fin body, a hard mask cap over each fin, the starting semiconductor structure also having a conformal blanket hard mask layer thereover. The method further includes forming a densified local isolation layer around the fins, resulting in a local fin structure, forming a protective layer around the local fin structure, resulting in a protected local fin structure, forming a densified global isolation layer on either side of the protected local fin structure up to a bottom surface of active areas of the plurality of fins, and exposing the active regions of the plurality of fins.

In accordance with another aspect, a semiconductor structure is provided. The semiconductor structure includes a strain-relaxed semiconductor substrate, a plurality of fins on the strain-relaxed semiconductor substrate, the plurality of fins each having a bottom inactive region and an exposed top active region, a liner layer along sidewalls of the bottom inactive region and adjacent surface areas of the strain-relaxed semiconductor substrate, a densified local fill layer surrounding the bottom inactive regions of the plurality of fins, a densified global fill layer adjacent outer sidewalls of the densified local fill layer, and a hard mask layer separating the densified global fill layer from the substrate and the densified local fill layer, a lack of voids in the densified local fill layer resulting in the bottom inactive regions of the plurality of fins being substantially free of oxidation defects.

These, and other objects, features and advantages of this invention will become apparent from the following detailed description of the various aspects of the invention taken in conjunction with the accompanying drawings.

DETAILED DESCRIPTION OF THE INVENTION

Figure 1:
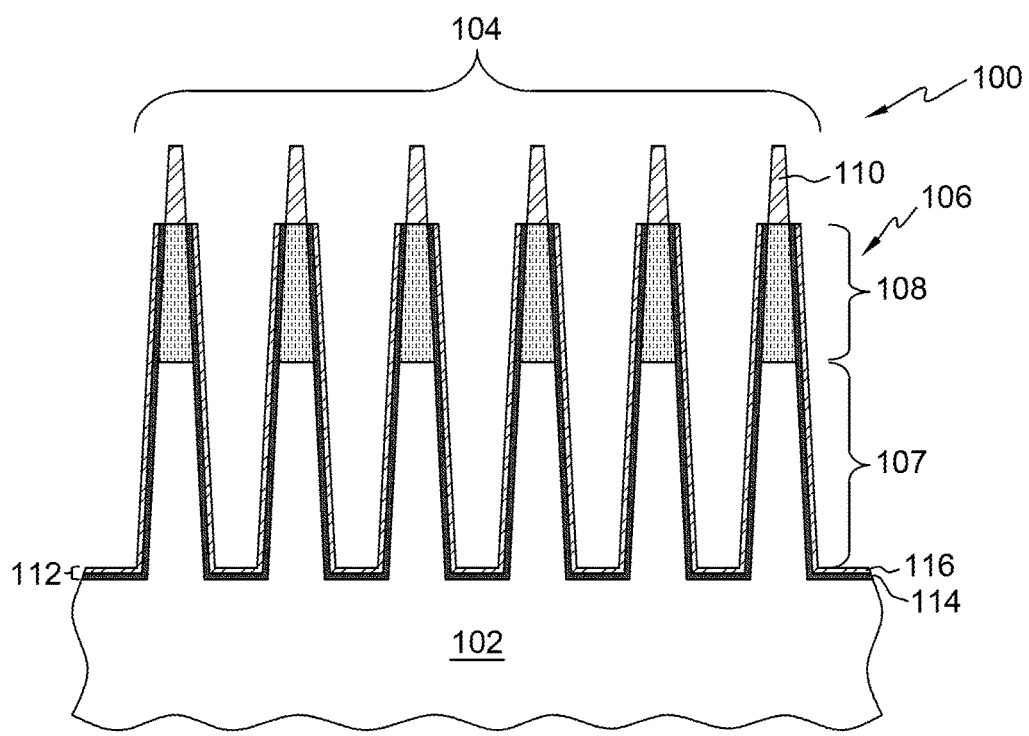
FIG. 1 is a cross-sectional view of one example of a starting semiconductor structure, the starting semiconductor substrate including a strain-relaxed semiconductor substrate, fins on the substrate, each fin including a bottom inactive region and a top active region, a fin hard mask layer over the fin, and a liner layer conformally covering the fins and substrate, the liner layer including, for example, an inner dielectric layer and an outer hard mask layer, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of plus or minus five percent of the value.

Reference is made below to the drawings, which are not drawn to scale for ease of understanding, wherein the same reference numbers are used throughout different figures to designate the same or similar components.

FIG. 1 is a cross-sectional view of one example of a starting semiconductor structure 100, the starting semiconductor structure including a strain-relaxed semiconductor substrate 102, fins 104 on the substrate, each fin (e.g., fin 106) including a bottom inactive region 107 and a top active region 108, a fin hard mask layer 110 (e.g., silicon nitride) over the fin, and a liner layer 112 conformally covering the fins and substrate, the liner layer including, for example, an inner dielectric layer 114 and an outer hard mask layer 116 (e.g., silicon nitride), in accordance with one or more aspects of the present invention.

The starting structure may be conventionally fabricated, for example, using known processes and techniques. Further, unless noted otherwise, conventional processes and techniques may be used to achieve individual steps of the fabrication process of the present invention. However, although only a portion is shown for simplicity, it will be understood that, in practice, many such structures are typically included on the same substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

The fins may be, for example, etched from a bulk substrate, and may include, for example, any of the materials listed above with respect to the substrate. Further, some or all of the fins may include added impurities (e.g., by doping), making them n-type or p-type.

Figure 2:
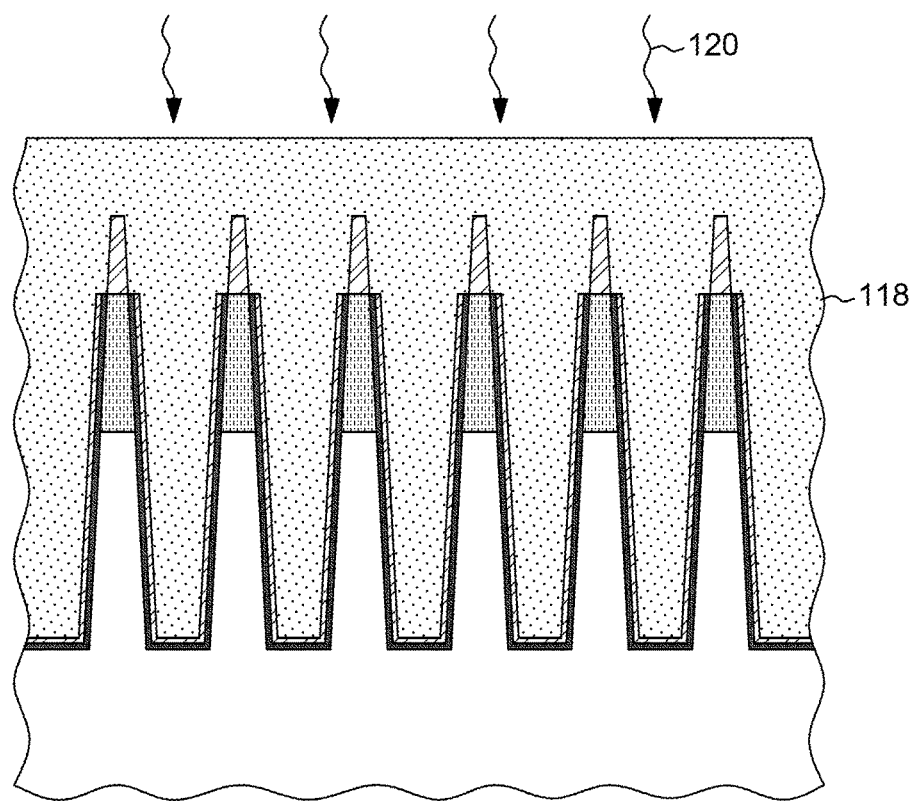
FIG. 2 depicts one example of the starting semiconductor structure of FIG. 1 after forming a blanket conformal dielectric gap fill layer (e.g., a flowable oxide) and performing a densification anneal, in accordance with one or more aspects of the prevent invention.

FIG. 2 depicts one example of the starting semiconductor structure 100 of FIG. 1 after forming a blanket conformal dielectric gap fill layer 118 (e.g., a flowable oxide) and performing a densification anneal 120, in accordance with one or more aspects of the present invention.

Figure 3:
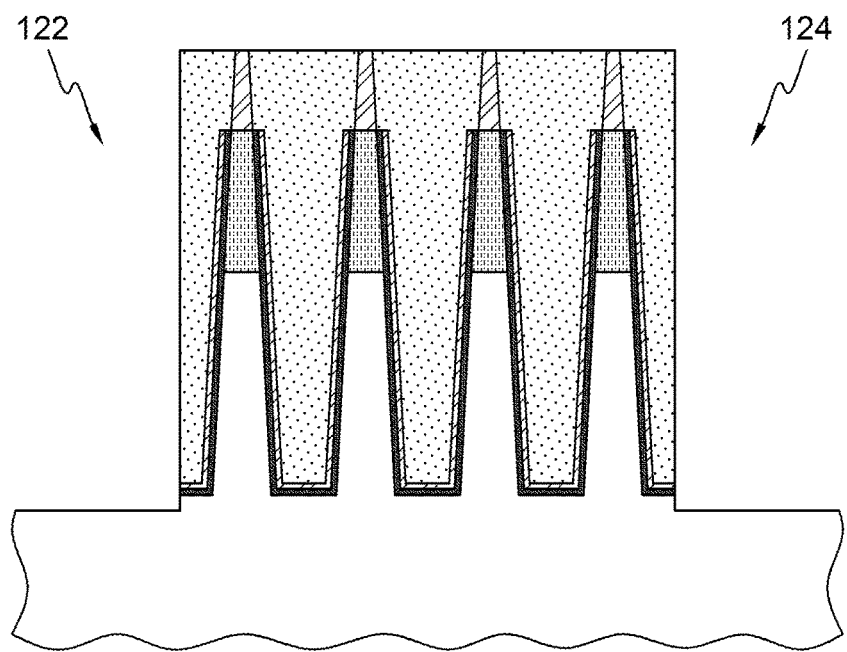
FIG. 3 depicts one example of the structure of FIG. 2 after performing a fin cut; in this example, opening areas, in accordance with one or more aspects of the present invention.

FIG. 3 depicts one example of the structure of FIG. 2 after performing a fin cut; in this example, opening areas 122 and 124, in accordance with one or more aspects of the present invention.

Figure 4:
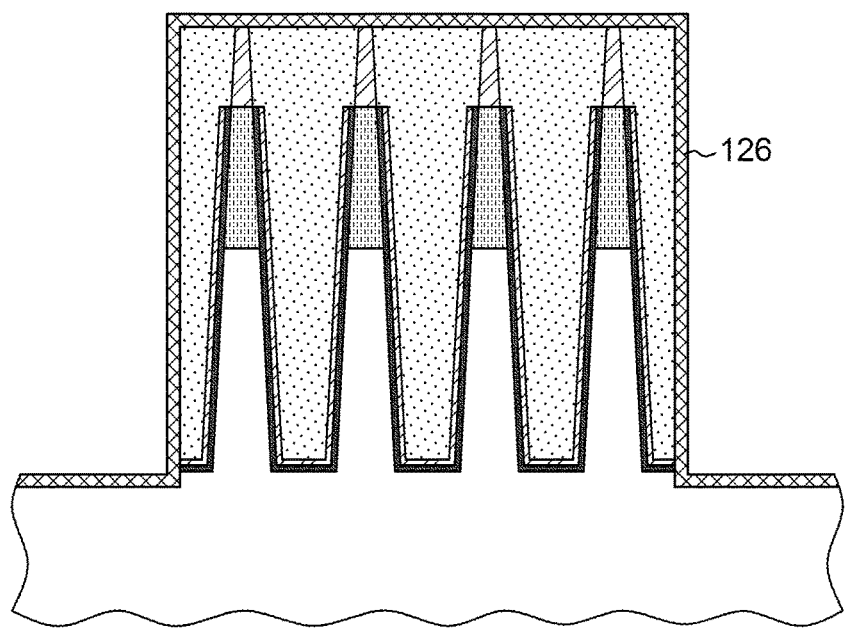
FIG. 4 depicts one example of the structure of FIG. 3 after forming a hard mask layer over the structure and substrate, in accordance with one or more aspects of the present invention.

FIG. 4 depicts one example of the structure of FIG. 3 after forming a hard mask layer 126 (e.g., silicon nitride) over the structure and substrate, in accordance with one or more aspects of the present invention.

Figure 5:
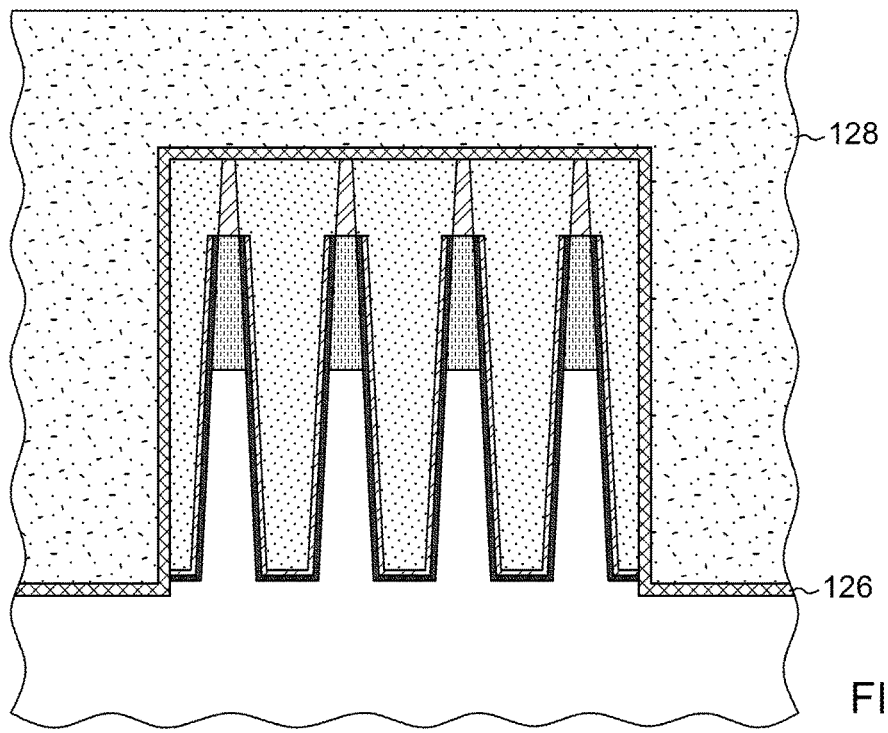
FIG. 5 depicts one example of the structure of FIG. 4 after forming a blanket dielectric layer (e.g., using a flowable oxide), in accordance with one or more aspects of the present invention.

FIG. 5 depicts one example of the structure of FIG. 4 after forming a blanket dielectric layer 128 (e.g., using a flowable oxide), in accordance with one or more aspects of the present invention.

Figure 6:
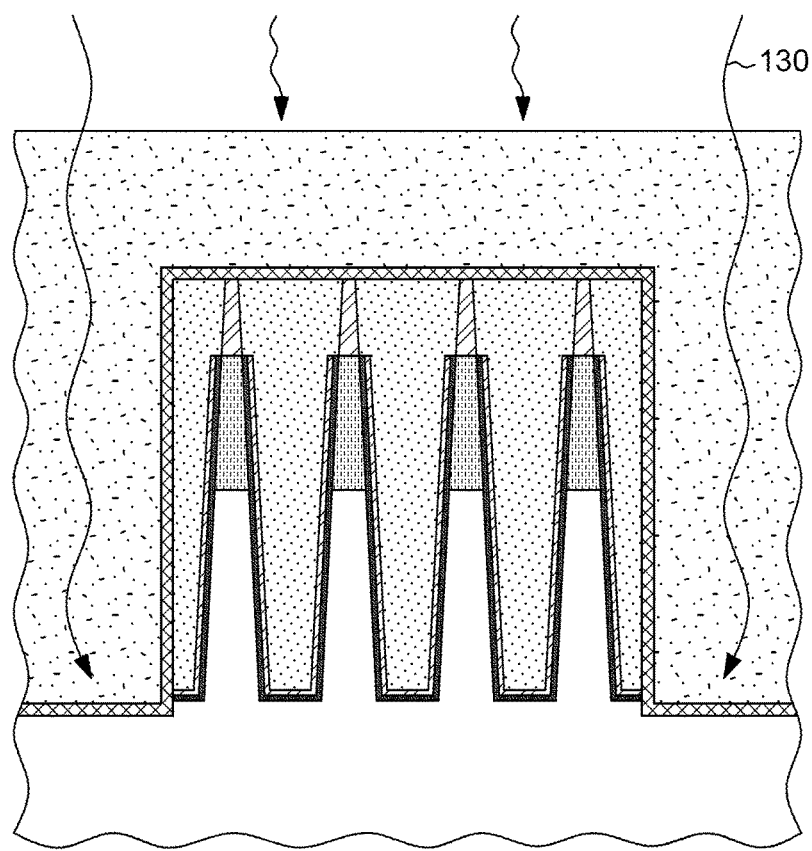
FIG. 6 depicts one example of the structure after performing a second densification anneal of the blanket dielectric layer, in accordance with one or more aspects of the present invention.

FIG. 6 depicts one example of the structure after performing a second densification anneal 130 of the blanket dielectric layer 128, in accordance with one or more aspects of the present invention.

Figure 7:
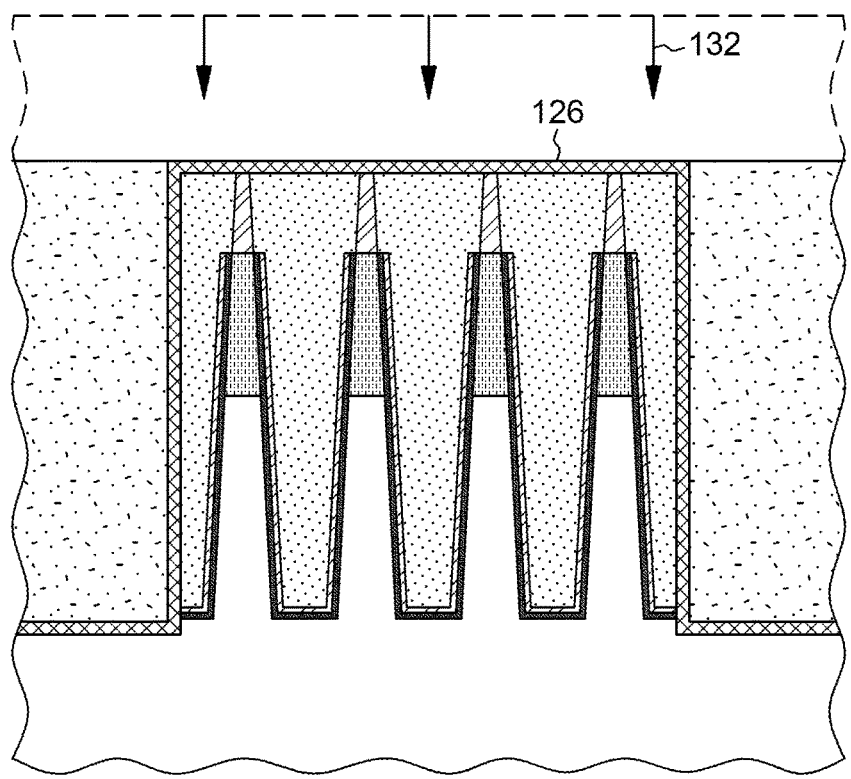
FIG. 7 depicts one example of the structure of FIG. 6 after planarizing down to the hard mask layer, in accordance with one or more aspects of the present invention.

FIG. 7 depicts one example of the structure of FIG. 6 after planarizing 132 down to hard mask layer 126, in accordance with one or more aspects of the present invention.

Figure 8:
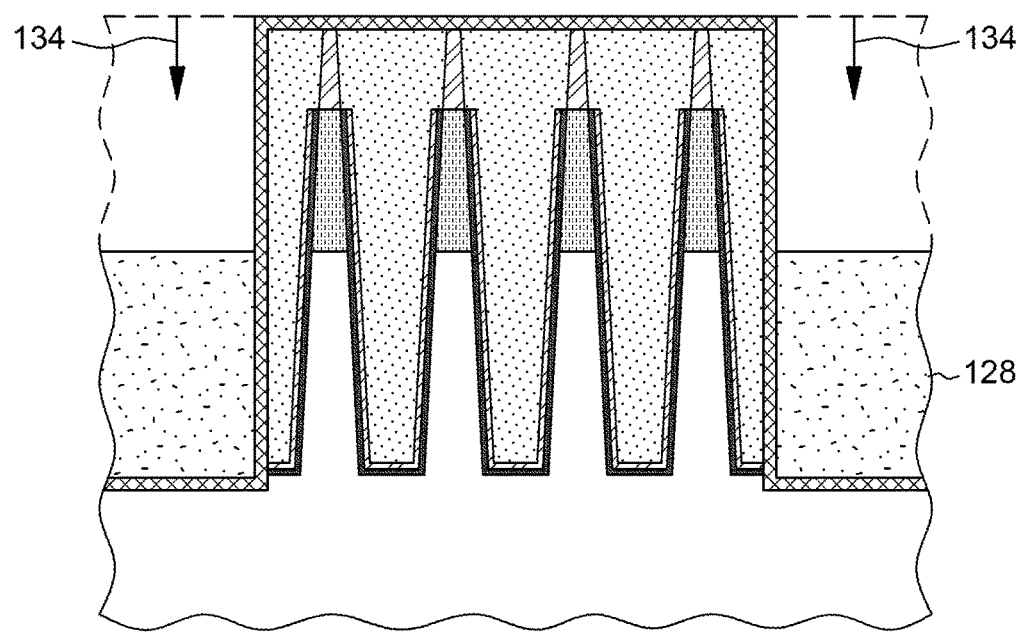
FIG. 8 depicts one example of the structure of FIG. 7 after recessing the blanket dielectric layer, in accordance with one or more aspects of the present invention.

FIG. 8 depicts one example of the structure of FIG. 7 after recessing 134 the blanket dielectric layer 128, in accordance with one or more aspects of the present invention.

Figure 9:
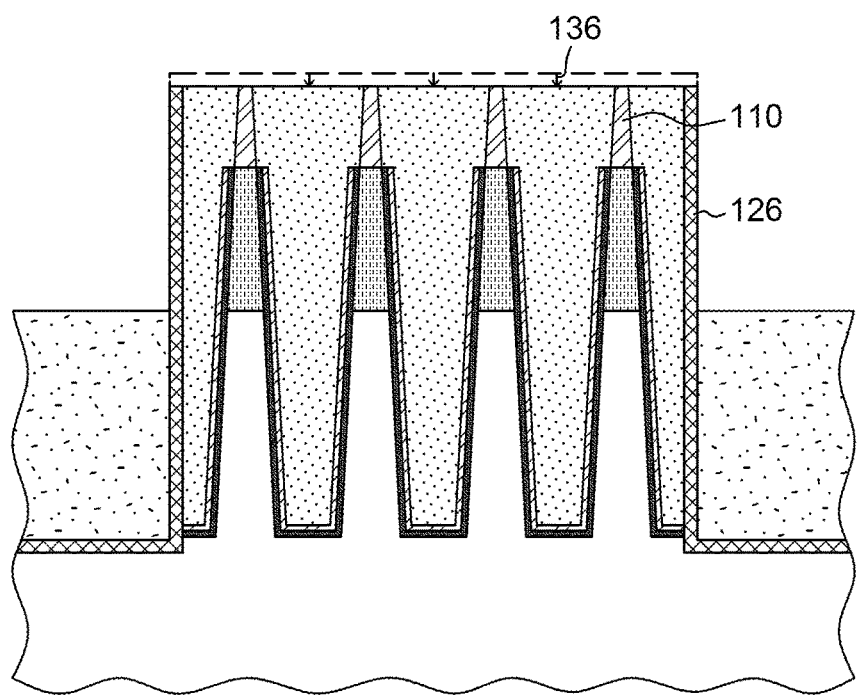
FIG. 9 depicts one example of the structure of FIG. 8 after etching back the hard mask layer down to the fin hard mask layer, in accordance with one or more aspects of the present invention.

FIG. 9 depicts one example of the structure of FIG. 8 after etching back 136 the hard mask layer 126 down to the fin hard mask layer 110, in accordance with one or more aspects of the present invention.

Figure 10:
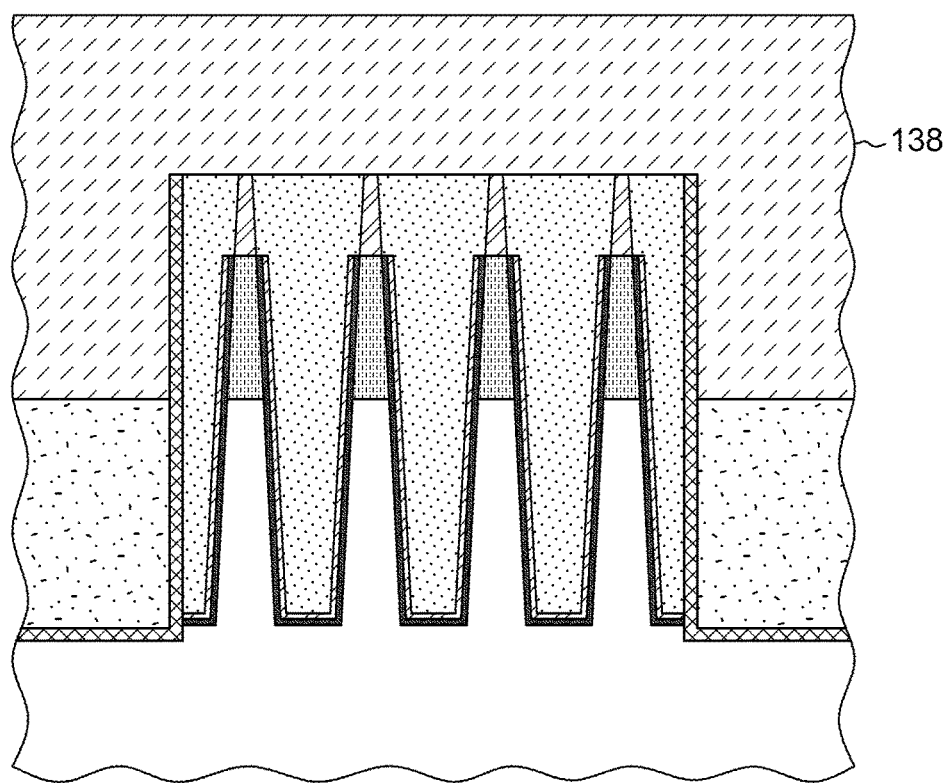
FIG. 10 depicts one example of the structure of FIG. 9 after forming an optical planarization layer (OPL) over the structure, in accordance with one or more aspects of the present invention.

FIG. 10 depicts one example of the structure of FIG. 9 after forming an optical planarization (OPL) 138 over the structure, in accordance with one or more aspects of the present invention.

Figure 11:
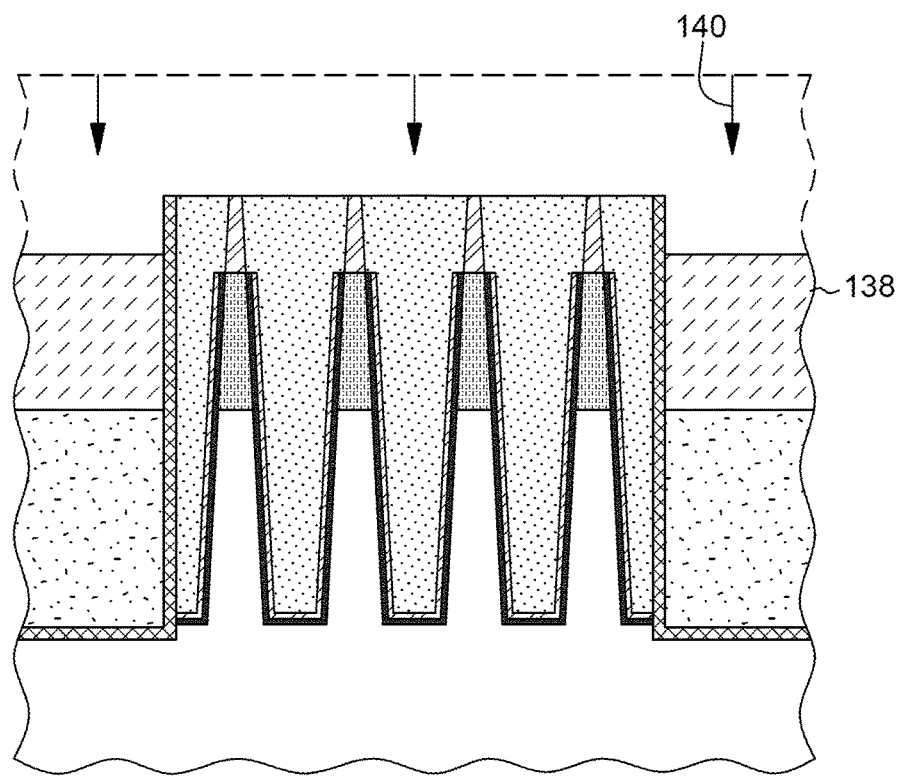
FIG. 11 depicts one example of the structure of FIG. 10 after recessing the OPL, in accordance with one or more aspects of the present invention.

FIG. 11 depicts one example of the structure of FIG. 10 after recessing 140 the OPL 138, in accordance with one or more aspects of the present invention.

Figure 12:
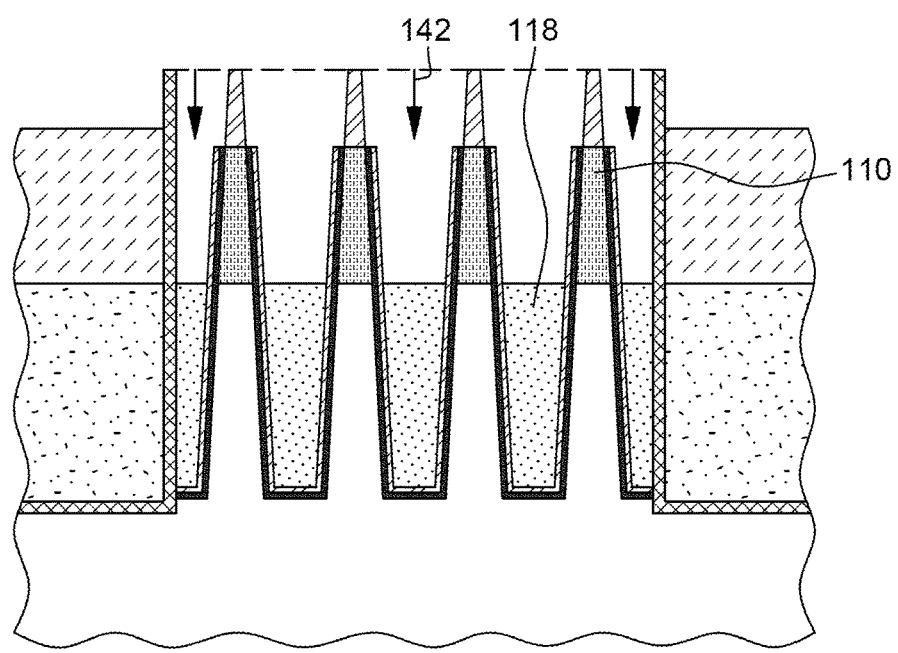
FIG. 12 depicts one example of the structure of FIG. 11 after recessing the blanket conformal dielectric gap fill layer down to a bottom of fin active region, in accordance with one or more aspects of the present invention.

FIG. 12 depicts one example of the structure of FIG. 11 after recessing 142 the blanket conformal dielectric gap fill layer 118 down to a bottom of fin active region 108, in accordance with one or more aspects of the present invention.

Figure 13:
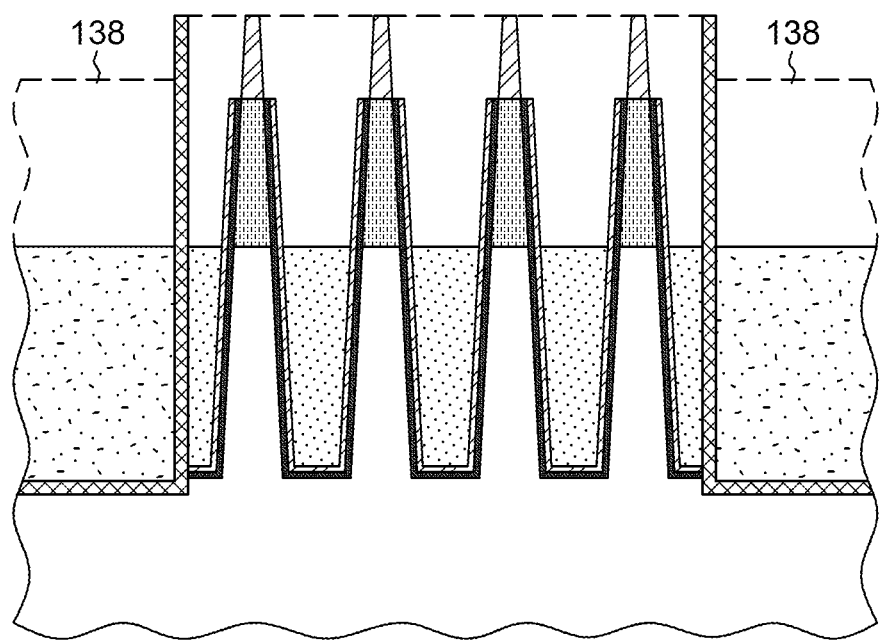
FIG. 13 depicts one example of the structure of FIG. 12 after removing the remaining OPL, in accordance with one or more aspects of the present invention.

FIG. 13 depicts one example of the structure of FIG. 12 after removing the remaining OPL 138, in accordance with one or more aspects of the present invention.

Figure 14:
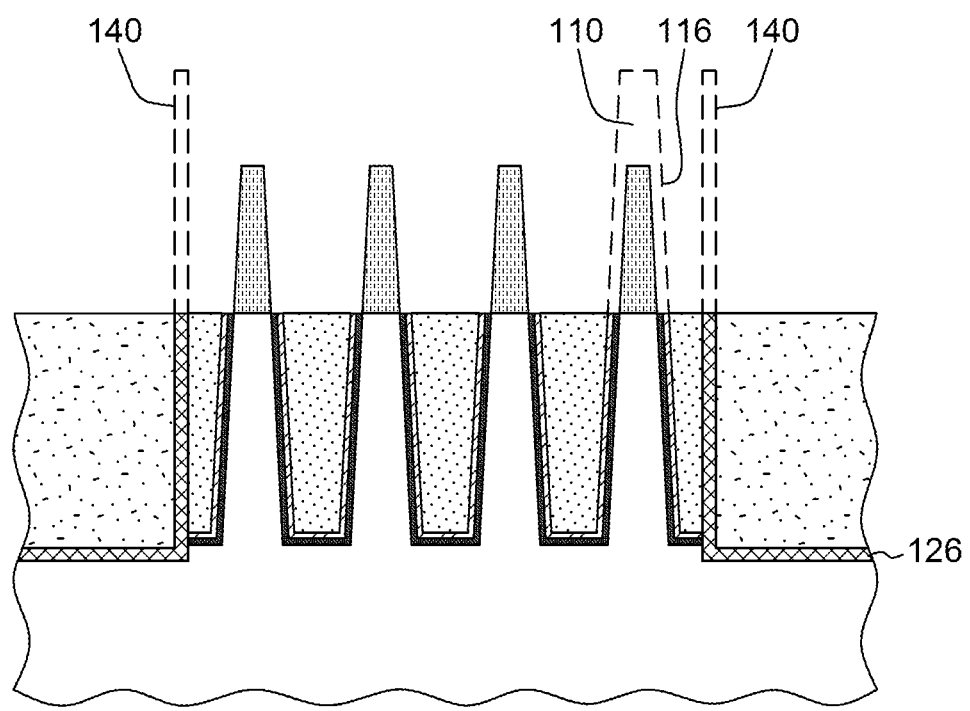
FIG. 14 depicts one example of the structure of FIG. 13 after removing exposed portions of the hard mask layer, the fin hard mask layer and the exposed liner layer, in accordance with one or more aspects of the present invention.

FIG. 14 depicts one example of the structure of FIG. 13 after removing exposed portions 140 of hard mask layer 126, fin hard mask layer 110 and exposed liner layer 112, in accordance with one or more aspects of the present invention.

In a first aspect, disclosed above is a method. The method includes providing a starting semiconductor structure, the starting semiconductor structure including a stress-relaxed buffer (SRB) semiconductor substrate with a relatively low concentration of germanium in silicon germanium, fins coupled to the SRB semiconductor substrate, each fin including a top active region with a relatively higher percentage of germanium in silicon germanium as compared to the SRB semiconductor substrate, and a bottom fin body, a hard mask cap over each fin, the starting semiconductor structure also having a conformal blanket hard mask layer thereover. The method further includes forming a densified local isolation layer around the fins, resulting in a local fin structure, forming a protective layer around the local fin structure, resulting in a protected local fin structure, forming a densified global isolation layer on either side of the protected local fin structure up to a bottom surface of active areas of the plurality of fins, and exposing the active regions of the plurality of fins.

In one example, forming the densified local isolation layer may include, for example, forming a local isolation layer around the fins, and annealing the local isolation layer, resulting in the densified local isolation layer. In one example, forming the local isolation layer around the fins may include, for example, forming a layer of silicon dioxide using a chemical-vapor deposition process.

In one example, forming the protective layer in the method of the first aspect may include, for example, forming a hard mask layer.

In one example, forming the densified global isolation layer in the method of the first aspect may include, for example, forming a global isolation layer over the structure, and annealing the global isolation layer, resulting in the densified global isolation layer. In one example, forming the global isolation layer may include, for example, forming a global silicon dioxide layer using a chemical-vapor deposition process.

In one example, exposing the active regions of the fins in the method of the first aspect may include, for example, removing a top horizontal portion of the protective layer, recessing the densified local isolation layer down to the bottom surfaces of the active areas of the fins, the recessing resulting in exposed hard mask material, and removing the exposed hard mask material, leaving the active areas exposed. In one example, removing the exposed hard mask layer may include, for example, selective removal of the exposed hard mask layer.

In one example, the method may further include, for example, after removing the top horizontal portion and before recessing the densified local isolation layer, forming a protective layer around the structure, and recessing the protective layer to expose the densified local isolation layer, hard mask caps and side portions of the conformal blanket hard mask layer.

In one example, the method of the first aspect may further include, for example, after forming the densified local isolation layer and before forming the protective layer around the local fin structure, removing unwanted fins and associated portions of the densified local isolation layer, and forming the protective layer around the remaining fins and associated densified local isolation layer.

In a second aspect, disclosed above is a semiconductor structure. The semiconductor structure includes a strain-relaxed semiconductor substrate, fins on the strain-relaxed semiconductor substrate, the fins each having a bottom inactive region and an exposed top active region. The semiconductor structure further includes a liner layer along sidewalls of the bottom inactive region and adjacent surface areas of the strain-relaxed semiconductor substrate, a densified local fill layer surrounding the bottom inactive regions of the fins, a densified global fill layer adjacent outer sidewalls of the densified local fill layer, and a hard mask layer separating the densified global fill layer from the substrate and the densified local fill layer, a lack of voids in the densified local fill layer resulting in the bottom inactive regions of the fins being substantially free (e.g., at least about 90%) of oxidation defects.

In one example, the fins may include, for example, n-type fin(s) and p-type fin(s). In one example, the strain-relaxed semiconductor substrate may include, for example, silicon germanium, the n-type fin(s) includes silicon, and the p-type fin(s) includes silicon germanium of a higher germanium concentration than the strain-relaxed semiconductor substrate.

In one example, the densified local gap fill layer of the semiconductor structure of the second aspect may include, for example, a flowable oxide.

In one example, the densified global gap fill layer of the semiconductor structure of the second aspect may include for example, a flowable oxide.

In one example, the liner layer of the semiconductor structure of the second aspect may include, for example, an inner dielectric layer, and an outer hard mask layer.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
 providing a starting semiconductor structure, the starting semiconductor structure comprising a stress-relaxed buffer (SRB) semiconductor substrate with a relatively low concentration of germanium in silicon germanium, a plurality of fins coupled to the SRB semiconductor substrate, each fin comprising a top active region with a relatively higher percentage of germanium in silicon germanium as compared to the SRB semiconductor substrate, and a bottom fin body, a hard mask cap over each fin, the starting semiconductor structure also having a conformal blanket hard mask layer thereover;

forming a densified local isolation layer around the fins, resulting in a local fin structure;

forming a protective layer around the local fin structure, resulting in a protected local fin structure;

forming a densified global isolation layer on either side of the protected local fin structure up to a bottom surface of active areas of the plurality of fins; and exposing the active regions of the plurality of fins, wherein exposing the active regions of the plurality of fins comprises:

removing a top horizontal portion of the protective layer;

recessing the densified local isolation layer down to the bottom surfaces of the active areas of the plurality of fins, the recessing resulting in an exposed portion of the protective layer; and removing the exposed portion of the protective layer, leaving the active areas exposed.

2. The method of claim 1, wherein forming the densified local isolation layer comprises:

forming a local isolation layer around the fins; and annealing the local isolation layer, resulting in the densified local isolation layer.

3. The method of claim 2, wherein forming the local isolation layer around the fins comprises forming a layer of silicon dioxide using a chemical-vapor deposition process.

4. The method of claim 1, wherein forming the protective layer comprises forming a hard mask layer.

5. The method of claim 1, wherein forming the densified global isolation layer comprises:

forming a global isolation layer over the structure; and annealing the global isolation layer, resulting in the densified global isolation layer.

6. The method of claim 5, wherein forming the global isolation layer comprises forming a global silicon dioxide layer using a chemical-vapor deposition process.

7. The method of claim 1, wherein removing the exposed portion of the protective layer comprises selective removal of the exposed portion of the protective layer.

8. The method of claim 1, further comprising after forming the densified local isolation layer and before forming the protective layer around the local fin structure, removing one or more unwanted fins of the plurality of fins and associated portions of the densified local isolation layer, and forming the protective layer around remaining fins and associated densified local isolation layer.

9. A method, comprising:

providing a starting semiconductor structure, the starting semiconductor structure comprising a stress-relaxed buffer (SRB) semiconductor substrate with a relatively low concentration of germanium in silicon germanium, a plurality of fins coupled to the SRB semiconductor substrate, each fin comprising a top active region with a relatively higher percentage of germanium in silicon germanium as compared to the SRB semiconductor substrate, and a bottom fin body, a hard mask cap over each fin, the starting semiconductor structure also having a conformal blanket hard mask layer thereover;

forming a densified local isolation layer around the fins, resulting in a local fin structure;

forming a protective layer around the local fin structure, resulting in a protected local fin structure;

forming a densified global isolation layer on either side of the protected local fin structure up to a bottom surface of active areas of the plurality of fins;

exposing the active regions of the plurality of fins;

removing a top horizontal portion of the protective layer;

recessing the densified local isolation layer down to the bottom surfaces of the active areas of the plurality of fins, the recessing resulting in an exposed portion of the protective layer;

removing the exposed portion of the protective layer, leaving the active areas exposed;

after removing the top horizontal portion and before recessing the densified local isolation layer, forming a protective layer around the structure; and recessing the protective layer to expose the densified local isolation layer, hard mask caps and side portions of the conformal blanket hard mask layer.

10. The method of claim 9, wherein forming the densified local isolation layer comprises:

forming a local isolation layer around the fins; and annealing the local isolation layer, resulting in the densified local isolation layer.

11. The method of claim 10, wherein forming the local isolation layer around the fins comprises forming a layer of silicon dioxide using a chemical-vapor deposition process.

12. The method of claim 10, wherein forming the protective layer comprises forming a hard mask layer.

13. The method of claim 10, wherein forming the densified global isolation layer comprises:

forming a global isolation layer over the structure; and annealing the global isolation layer, resulting in the densified global isolation layer.

14. The method of claim 13, wherein forming the global isolation layer comprises forming a global silicon dioxide layer using a chemical-vapor deposition process.

15. The method of claim 10, further comprising after forming the densified local isolation layer and before forming the protective layer around the local fin structure, removing one or more unwanted fins of the plurality of fins and associated portions of the densified local isolation layer, and forming the protective layer around remaining fins and associated densified local isolation layer.

16. The method of claim 9, wherein removing the exposed hard mask portion of the protective layer comprises selective removal of the exposed hard mask portion of the protective layer.

* * * * *